US012708031B2

(12) United States Patent
Choi et al.

(10) Patent No.: US 12,708,031 B2
(45) Date of Patent: Aug. 11, 2026

(54) SEMICONDUCTOR PACKAGE AND MANUFACTURING METHOD THEREFOR

(71) Applicant: LG INNOTEK CO., LTD., Seoul (KR)

(72) Inventors: Tae Sup Choi, Seoul (KR); Woon Kang, Seoul (KR); Jin Ho Yoon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 372 days.

(21) Appl. No.: 18/269,172

(22) PCT Filed: Jan. 18, 2022

(86) PCT No.: PCT/KR2022/000942
§ 371 (c)(1),
(2) Date: Jun. 22, 2023

(87) PCT Pub. No.: WO2022/154648
PCT Pub. Date: Jul. 21, 2022

(65) Prior Publication Data

US 2024/0136322 A1 Apr. 25, 2024
US 2024/0234364 A9 Jul. 11, 2024

(30) Foreign Application Priority Data

Jan. 18, 2021 (KR) ........................ 10-2021-0006590

(51) Int. Cl.
*H10W 74/15* (2026.01)
*H10W 74/01* (2026.01)
(Continued)

(52) U.S. Cl.
CPC ......... *H10W 74/15* (2026.01); *H10W 74/012* (2026.01); *H10W 74/47* (2026.01);
(Continued)

(58) Field of Classification Search
CPC ..... H01L 24/81; H01L 21/563; H01L 23/293; H01L 24/16; H01L 24/29; H01L 24/32;
(Continued)

(56) References Cited

U.S. PATENT DOCUMENTS

2004/0112636 A1* 6/2004 Kawai ............... H01L 23/49855
257/E21.511
2008/0122084 A1 5/2008 Hwang et al.
(Continued)

FOREIGN PATENT DOCUMENTS

JP 11-168122 A 6/1999
JP 2004-200281 A 7/2004
(Continued)

*Primary Examiner* — Patricia D Valenzuela
(74) *Attorney, Agent, or Firm* — Birch, Stewart, Kolasch & Birch, LLP

(57) ABSTRACT

A semiconductor package comprises: a printed circuit board including a connection portion; an IC chip arranged on the printed circuit board; a solder portion arranged on the lower surface of the IC chip and coupled to the connection portion; a bonding layer arranged between the solder portion and the connection portion; and an underfill arranged between the IC chip and the printed circuit board, wherein the bonding layer includes thermosetting resin, and the underfill include thermoplastic resin.

14 Claims, 5 Drawing Sheets

(51) Int. Cl.
*H10W 74/47* (2026.01)
*H10W 72/00* (2026.01)
*H10W 72/20* (2026.01)
*H10W 72/30* (2026.01)
*H10W 90/00* (2026.01)
*H10W 99/00* (2026.01)

(52) U.S. Cl.
CPC *H10W 72/01223* (2026.01); *H10W 72/01323* (2026.01); *H10W 72/072* (2026.01); *H10W 72/07231* (2026.01); *H10W 72/07234* (2026.01); *H10W 72/07236* (2026.01); *H10W 72/07237* (2026.01); *H10W 72/073* (2026.01); *H10W 72/07334* (2026.01); *H10W 72/07338* (2026.01); *H10W 72/241* (2026.01); *H10W 72/332* (2026.01); *H10W 72/354* (2026.01); *H10W 90/724* (2026.01); *H10W 90/734* (2026.01); *H10W 99/00* (2026.01)

(58) Field of Classification Search
CPC ......... H01L 24/73; H01L 24/83; H01L 24/92; H01L 2224/1131; H01L 2224/16227; H01L 2224/2731; H01L 2224/29015; H01L 2224/2919; H01L 2224/32225; H01L 2224/73204; H01L 2224/81192; H01L 2224/8121; H01L 2224/81395; H01L 2224/81447; H01L 2224/8149; H01L 2224/81815; H01L 2224/81862; H01L 2224/81906; H01L 2224/83102; H01L 2224/83191; H01L 2224/8321; H01L 2224/83862; H01L 2224/9211; H01L 2924/0665; H01L 2924/069; H01L 2224/131; H01L 2224/1369; H01L 2224/16225; H01L 2224/73203; H01L 2224/83192; H01L 24/13; H01L 2224/81191; H01L 2224/92125; H01L 2924/00; H01L 2924/00012; H01L 2924/00014; H01L 2924/01005; H01L 2924/01006; H01L 2924/01029; H01L 2924/01033; H01L 2924/01047; H01L 2924/01082; H01L 2924/014; H01L 23/492; H01L 23/50; H01L 24/10; H01L 24/26; H10W 74/15; H10W 74/012; H10W 74/47; H10W 72/01223; H10W 72/01323; H10W 72/072; H10W 72/07231; H10W 72/07234; H10W 72/07236; H10W 72/07237; H10W 72/073; H10W 72/07334; H10W 72/07338; H10W 72/241; H10W 72/332; H10W 72/354; H10W 90/724; H10W 90/734; H10W 99/00; H10W 72/856; H10W 72/252; H10W 72/255; H10W 70/20; H10W 72/00; H10W 72/20; H10W 72/30
See application file for complete search history.

(56) References Cited

U.S. PATENT DOCUMENTS

| | | | | |
|---|---|---|---|---|
| 2008/0135283 | A1* | 6/2008 | Hibino .................... | H01L 24/16 257/E23.021 |
| 2014/0073088 | A1* | 3/2014 | Maeda .................... | H01L 24/81 438/107 |
| 2019/0284442 | A1 | 9/2019 | Watanabe et al. | |

FOREIGN PATENT DOCUMENTS

| | | | |
|---|---|---|---|
| JP | 2006-521703 | A | 9/2006 |
| JP | 2006-319253 | A | 11/2006 |
| JP | 2008-227359 | A | 9/2008 |
| JP | 2018-29176 | A | 2/2018 |
| KR | 10-0536978 | B1 | 12/2005 |
| KR | 10-0823699 | B1 | 4/2008 |
| KR | 10-2012-0065595 | A | 6/2012 |
| KR | 10-2014-0102597 | A | 8/2014 |
| WO | WO 2004/086845 | A2 | 10/2004 |
| WO | WO 2018/134860 | A1 | 7/2018 |

* cited by examiner

SEMICONDUCTOR PACKAGE AND MANUFACTURING METHOD THEREFOR

CROSS REFERENCE TO RELATED APPLICATIONS

This application is the National Phase of PCT International Application No. PCT/KR2022/000942, filed on Jan. 18, 2022, which claims priority under 35 U.S.C. § 119(a) to Patent Application No. 10-2021-0006590, filed in the Republic of Korea on Jan. 18, 2021, all of which are hereby expressly incorporated by reference into the present application.

TECHNICAL FIELD

The present embodiment relates to a semiconductor package and manufacturing method therefor.

BACKGROUND ART

Generally, SMT equipment is a kind of equipment in which after printing a solder on lands of the printed circuit board, the leads of the surface mount device are aligned and mounted on the lands printed with a creamy solder, and by applying infrared radiant heat to the printed circuit board on which the surface mount device is mounted, the solder is melted and attached to connect the leads of the surface mount device and the lands of the printed circuit board.

A production line for assembling surface mount components on a printed circuit board consists of several types of devices. Looking specifically, a surface mount (SMT) line configured with: a board loader for supplying printed circuit boards to the line; a screen printer for applying a solder paste on a pattern before mounting parts; a surface mounter for receiving surface mount parts from a surface mount part supply reel device (feeder or cassette) and mounting them on a board; a reflow oven for connecting the parts and patterns by melting the solder paste being applied after the surface mounter mounts all the parts on the board; a solder inspector for inspecting mounting state; a sorter for sorting the printed circuit boards being completed with surface mounting; and an unloader to remove sorted boards from the line.

When the surface mounting is completed in the surface mounting assembly line as described above, an underfill process is essential to improve the adhesion between the chip and the board, and the underfill process is performed by transferring the board completed with the surface mounting as described above to an underfill line. That is, the surface mounting process and the underfill process are separated and performed on separate lines.

In this way, conventionally, when mounting parts on a printed circuit board by a surface mounting method, since an underfill process line in which underfill resin is applied and cured between the chip and the board is separately configured after the surface mounting process in which parts are surface mounted, equipment and operating costs become high, and various problems related to the transfer are concerned because the board on which parts are surface mounted is transferred to an underfill line.

DETAILED DESCRIPTION THE INVENTION

Technical Subject

An object of the present embodiment is to provide a semiconductor package and manufacturing method therefor capable of improving production efficiency according to the reduction in the number of manufacturing processes.

Technical Solution

A semiconductor package according to an embodiment comprises: a printed circuit board including a connection portion; an IC chip being arranged on the printed circuit board; a solder portion being arranged on the lower surface of the IC chip and coupled to the connection portion; a bonding layer being arranged between the solder portion and the connection portion; and an underfill being arranged between the IC chip and the printed circuit board, wherein the bonding layer includes thermosetting resin, and wherein the underfill includes thermoplastic resin.

The material of the bonding layer may be epoxy.

The material of the underfill may be polyurethane.

The thickness of the bonding layer in an up and down direction may be smaller than half of the thickness of the solder portion in an up and down direction.

The thickness of the underfill in an up and down direction may be greater than the thickness of the solder portion in an up and down direction.

A method of manufacturing a semiconductor package according to an embodiment includes the steps of: (a) supplying a printed circuit board; (b) printing thermosetting resin on the printed circuit board; (c) applying a solder paste to the printed circuit board; (d) mounting an IC chip on the printed circuit board and applying thermoplastic resin around the IC chip; and (e) curing the thermosetting resin and the thermoplastic resin.

The thermoplastic resin includes polyurethane, and the thermosetting resin may include epoxy.

After the step (e), a step of inspecting mounting state of the IC chip may be included.

After the step (c), a step of dipping the IC chip in epoxy may be included.

A method of manufacturing a semiconductor package according to another embodiment comprises the steps of: (a) supplying a printed circuit board; (b) applying a solder paste to the printed circuit board; (c) dipping an IC chip in thermosetting resin; (d) mounting the IC chip on the printed circuit board and applying thermoplastic resin around the IC chip; and (e) curing the thermosetting resin and the thermoplastic resin.

Advantageous Effects

Through the present embodiment, since the conventional underfill process is not separately performed in the manufacturing process of the semiconductor package, there are advantages of productivity improvement, cost reduction, defect rate reduction, and repair possibility.

BEST MODE

Hereinafter, preferred embodiments of the present invention will be described in detail with reference to the accompanying drawings.

However, the technical idea of the present invention is not limited to some embodiments to be described, but may be implemented in various forms, and inside the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A. B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under) ", the meaning of not only an upward direction but also a downward direction based on one component may be included.

Figure 1:
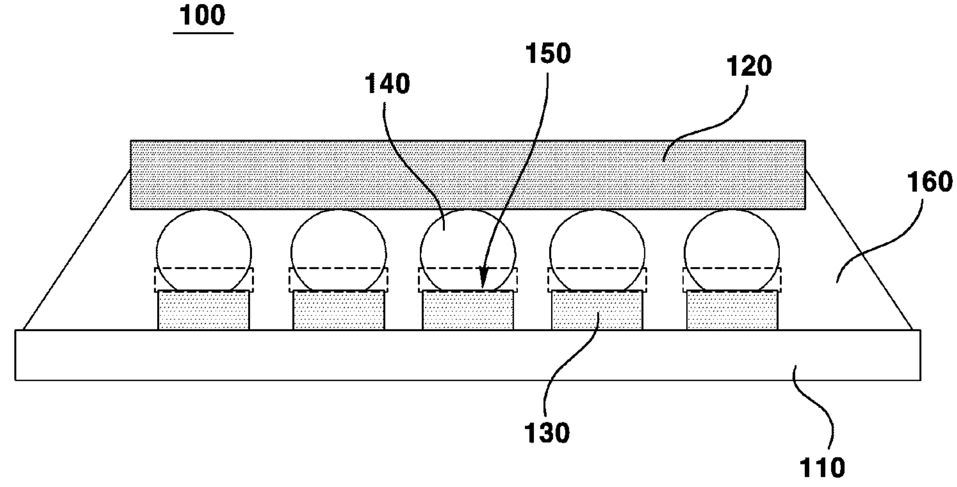
FIG. 1 is a cross-sectional view of a semiconductor package according to an embodiment of the present invention.

FIG. 1 is a cross-sectional view of a semiconductor package according to an embodiment of the present invention.

Referring to FIG. 1, a semiconductor package 100 according to an embodiment may comprise a printed circuit board 110, an IC chip 120, and an underfill 160.

The printed circuit board 110 is formed in a plate shape and may include a circuit pattern (not shown) for electrical connection. A connection portion 130 for electrical connection with the IC chip 120 may be disposed on an upper surface of the printed circuit board 110. The connection portion 130 may form a portion of the circuit pattern. The material of the connection portion 130 may include copper. The connection portion 130 is provided in plurality and may be spaced apart from one another. The IC chip 120 may be mounted on the printed circuit board 110 through the connection portion 130. The printed circuit board 110 and the IC chip 120 may be electrically connected through the connection portion 130.

The IC chip 120 may be disposed on the printed circuit board 110. The IC chip 120 may be surface mounted (SM) on the printed circuit board 110. Between the IC chip 120 and the printed circuit board 110, a solder unit 140 coupling the IC chip 120 onto the printed circuit board 110 may be disposed. The solder portion 140 may be a soldering area for mounting the IC chip 120 on the printed circuit board 110. The solder portion 140 may have a ball shape. The solder portion 140 may be coupled to the connection portion 130. The solder portion 140 and the connection portion 130 may face each other in an up and down direction. The solder portion 140 and the connection portion 130 may be in contact with each other.

A bonding layer 150 may be formed between the connection portion 130 and the solder portion 140. The bonding layer 150 is to firmly maintain the connection between the connection portion 130 and the solder portion 140 and may be disposed on are sipper surface of the connection portion 130 or a lower surface of the solder portion 140. The material of the bonding layer 150 may include thermosetting resin. For example, the bonding layer 150 may include epoxy. When the bonding layer 150 is cured in a reflow process, which will be described later, the bonding layer 150 may firmly fix the solder portion 140 on the connection portion 130.

The thickness of the bonding layer 150 in an up and down direction may be formed to be smaller than half of the thickness of the solder portion 140 in an up and down direction.

The semiconductor package 100 may include an underfill 160 being disposed between the printed circuit board 110 and the IC chip 120. The underfill 160 may include thermoplastic resin. For example, the material of the underfill 160 may include polyurethane. The underfill 160 serves as a structural support for the IC chip 120, and may be ejected and formed using capillary force after bonding to the printed circuit board 110.

The thickness of the underfill 160 in an up and down direction may be formed to be greater than the thickness of the solder portion 140 in an up and down direction.

Hereinafter, a method of manufacturing the semiconductor package 100 will be described.

Figure 2:
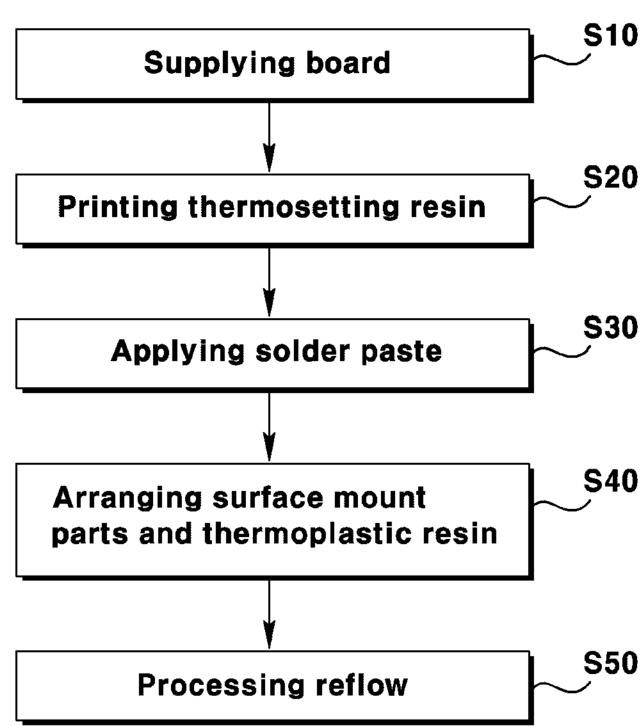
FIG. 2 is a flowchart illustrating a method of manufacturing a semiconductor package according to an embodiment of the present invention.
Figure 3:
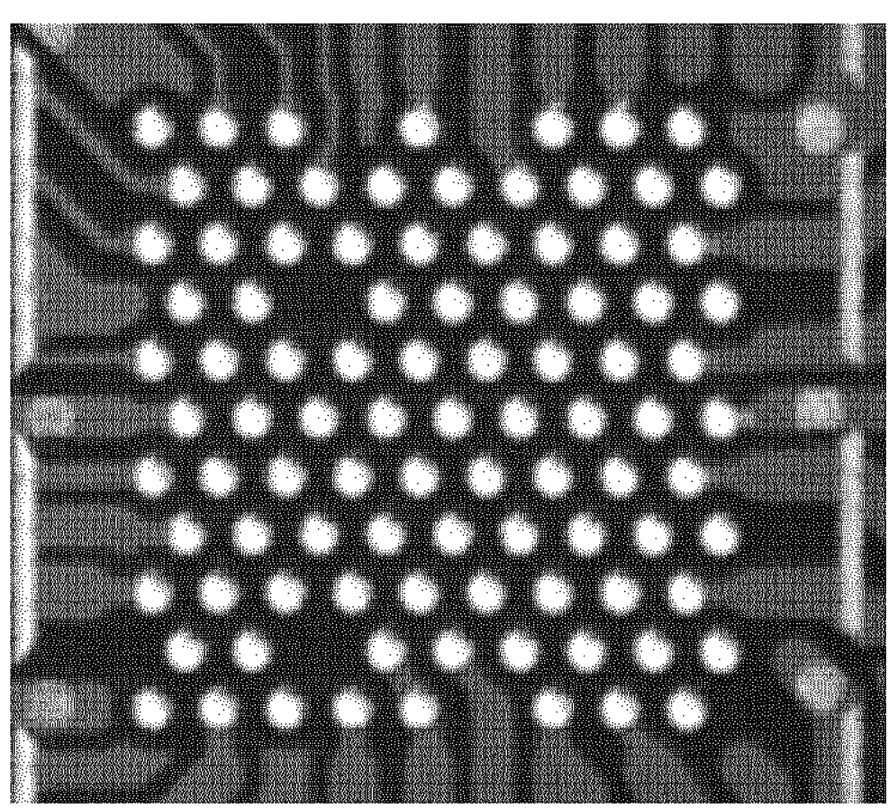
FIG. 3 is a view illustrating a state in which a bonding layer is formed on a printed circuit board according to an embodiment of the present invention.
Figure 4:
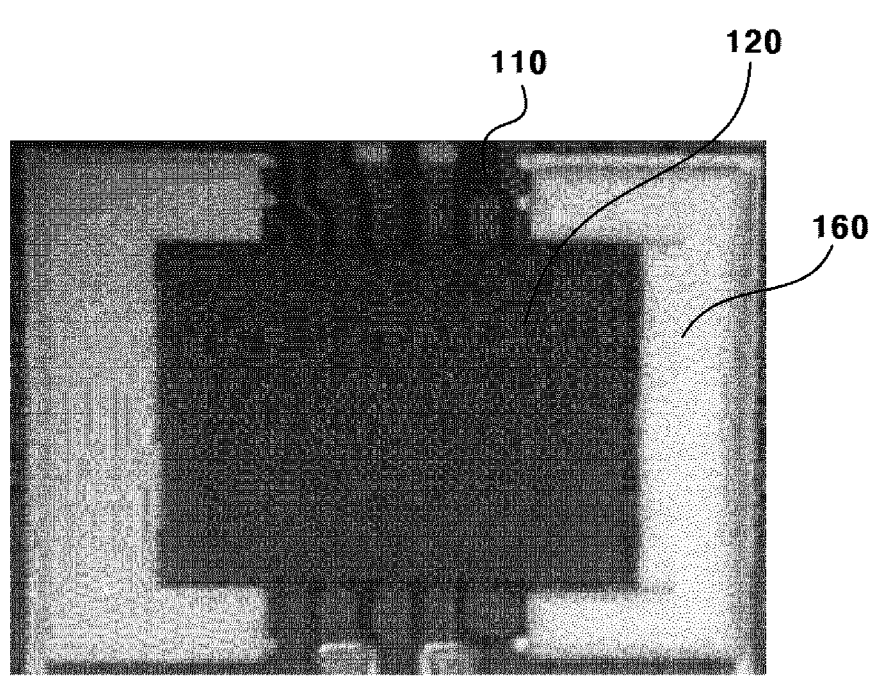
FIG. 4 is a view illustrating a state in which thermoplastic resin is applied on a printed circuit board according to an embodiment of the present invention.
Figure 5:
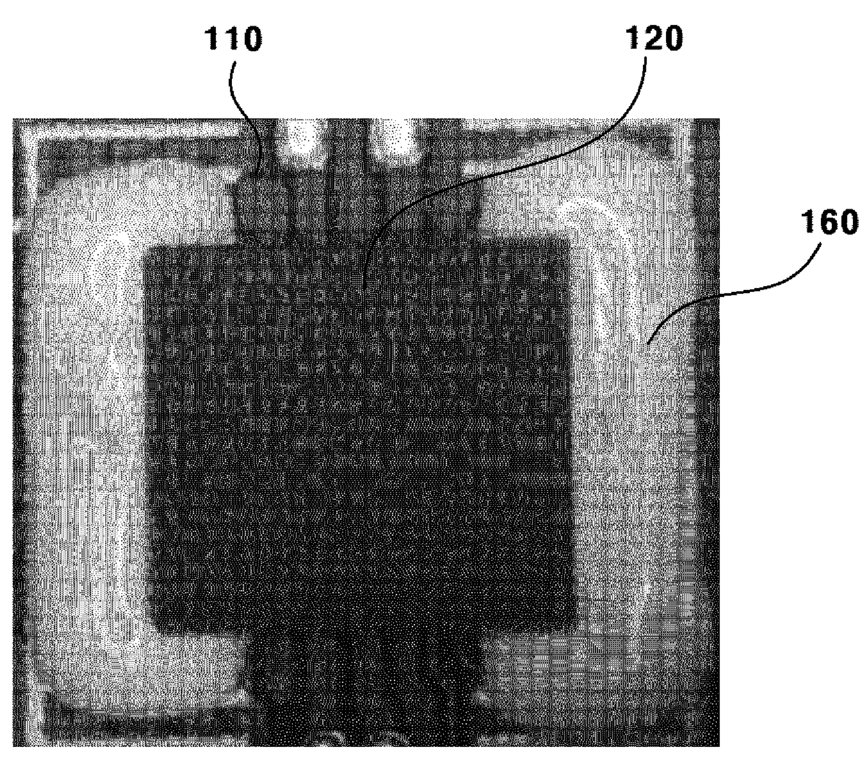
FIG. 5 is a view illustrating a cured state of the thermoplastic resin in FIG. 4.

FIG. 2 is a flowchart illustrating a method of manufacturing a semiconductor package according to an embodiment of the present invention; FIG. 3 is a view illustrating a state in which a bonding layer is formed on a printed circuit board according to an embodiment of the present mention; FIG. 4 is a view illustrating a state in which thermoplastic resin is applied on a printed circuit board according to an embodiment of the present invention; and FIG. 5 is a view illustrating a cured state of the thermoplastic resin in FIG. 4.

Referring to FIGS. 1 and 2, a method of manufacturing a semiconductor package according to the present embodiment comprises the steps of: supplying the printed circuit board 110 through a substrate supplier (S10), printing thermosetting resin on the printed circuit board 110 (S20); applying a solder paste to a pattern on which the IC chip 120 is mounted on the printed circuit board 110 and a pattern on which the underfill 160 is to be formed (S30); supplying the IC chip 120 on the printed circuit board 110 through a part supply unit and simultaneously disposing thermoplastic resin around the IC chip 120 on the printed circuit board 110 (S40); and curing the thermosetting resin and the thermoplastic resin, after the surface mounting process (S40), by heating through a reflow oven (S50). In addition to this; the method of manufacturing a semiconductor package may include a step of inspecting mounting state of the IC chip 120 on the printed circuit board 110, after the reflow process (S50).

In the case of a semiconductor package according to the prior art, it is cured in a reflow oven after going through the surface mounting process of various parts after applying a creamy solder (solder paste) to the printed circuit board. Separately from this, an underfill process should be performed in which defects such as cracks and bending is prevented by applying liquid epoxy to the side surface of parts such as BGA and CP on the printed circuit board that has gone through the SMT process, infiltrating it, and then curing it again through a curing furnace.

The manufacturing method of the semiconductor package according to the present embodiment is characterized in that the surface mounting process and the underfill process can be performed in a single line.

In detail, in the step of printing the thermosetting resin on the printed circuit board 110 (S20), the above-described step of forming the bonding layer 150 in the semiconductor package 10, epoxy, as shown in FIG. 3, may be printed on the printed circuit board 110 in the form of a gel-type resin. In the present embodiment, it is exemplified that the thermosetting resin is printed on the printed circuit board 110, but this is not limited thereto, and the thermosetting resin may be printed on a lower surface of the IC chip 120 being coupled to the printed circuit board 110.

In addition, in the step of disposing the thermoplastic resin around the IC chip 120 (S40), as shown in FIG. 4, it may be applied along the circumference of the IC chip 120 on an upper surface of the printed circuit board 110. In FIG. 4, a plurality of thermoplastic resins are provided and arranged to face each other with respect to the IC chip 120 as an example. The thermoplastic resin has a cross section in the shape of a letter "⊏" and may be disposed to surround three sides of the IC chip 120. A plurality of thermoplastic resins may be spaced apart from each other. In this case, the thermoplastic resin was exemplified only with a cross section in the shape of a letter '⊏', but examples may vary such as letter "□" and letter "L".

Accordingly, the thermoplastic resin is cured as shown in FIG. 5 through the reflow process (S50) may form the underfill 160 inside the semiconductor package 100.

In summary, the thermosetting resin is hardened through the reflow process (S50) to firmly fix the solder portion 140 on the connection portion 130, and the thermoplastic resin may permeate into the IC chip 120 by capillarity and firmly fix the coupled state between the printed circuit board 110 and the IC chip 120.

Meanwhile, the semiconductor package 100 may additionally undergo a secondary reflow process, and in this case, there is an advantage in that the bonding layer 150 can support the flow of the solder portion 140 due to the thermosetting characteristics of the bonding layer 150 during the melting process of the solder portion 140.

Figure 6:
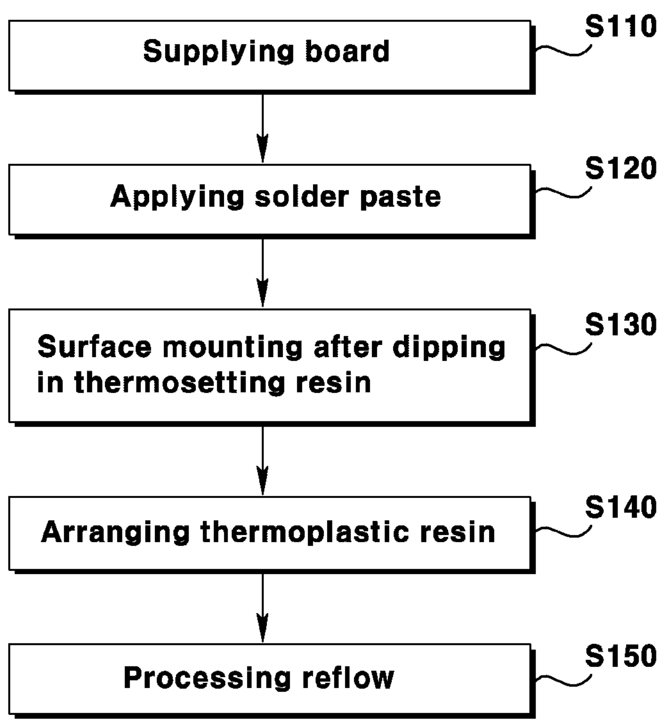
FIG. 6 is a flowchart illustrating a modified embodiment of a method of manufacturing a semiconductor package according to an embodiment of the present invention.

FIG. 6 is a flowchart illustrating a modified embodiment of a method of manufacturing a semiconductor package according to an embodiment of the present invention.

In the present modified embodiment, other parts are the same as the above-described embodiment, but there is a difference according to the bonding layer formation structure through the thermosetting resin. Therefore, only the characteristic parts of the present modified embodiment will be described below, and the description of the above-described embodiment will be used for the remaining parts.

Referring to FIG. 6, a method of manufacturing a semiconductor package may comprise the steps of: supplying the printed circuit board 110 through a substrate supplier (S110); applying a solder paste to a pattern where the IC chip 120 is to be mounted on the printed circuit board 110 and a pattern where the underfill 160 is to be formed (S120); surface mounting on the printed circuit board 110 after dipping the IC chip 120 in thermosetting resin (S130); arranging thermoplastic resin around the IC chip 120 on the printed circuit board 110 (S140); and after the surface mounting process (S140), heating through a reflow oven and curing the thermosetting resin and the thermoplastic resin (S150).

Therefore, in the present modified embodiment, thermosetting resin (for example, epoxy) for forming the bonding layer 150 may be applied to the bonding surface of the IC chip 120 being coupled to the printed circuit board 110 through dipping. The dipping process may be performed by dipping the IC chip 120 in epoxy flux, which is a gel type resin, and lifting it up. Since the epoxy flux is not a rosin flux, there is no residual flux of the thermosetting resin in the reflow step (S150), so there is an advantage in that a separate cleaning or curing process is not required.

Meanwhile, the step of forming the bonding layer 150 through the thermosetting resin has been described separately as a step of printing on the printed circuit board 110 and a step of dipping the IC chip 120, but it is not necessarily to implement this exclusively, and of course the step of printing on the printed circuit board 110 and the step of dipping the IC chip 120 may be performed together within a single semiconductor package manufacturing process.

According to the structure as described above, since a conventional underfill process is not separately performed in the manufacturing process of a semiconductor package, there are advantages in productivity improvement, cost reduction, defect rate reduction, and repair.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but, to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A semiconductor package comprising:

a printed circuit board including a connection portion;

an IC chip arranged on the printed circuit board;

a solder portion arranged on the lower surface of the IC chip and coupled to the connection portion;

a bonding layer arranged between the solder portion and the connection portion; and an underfill arranged between the IC chip and the printed circuit board, wherein the bonding layer includes thermosetting resin, wherein the underfill includes thermoplastic resin, wherein the bonding layer comprises printing epoxy on the printed circuit board in a form of a gel-type resin, wherein the IC chip includes a first side, a second side opposing the first side, a third side connecting the first and second sides, and a fourth side opposing the third side, wherein the underfill includes a first underfill that overlaps, in a vertical direction, the first side and at least a portion of the third and fourth sides, and a second underfill that overlaps, in the vertical direction, the second side and at least another portion of the third and fourth sides, and wherein the first underfill and the second underfill are horizontally spaced apart from each other at the third side and the fourth side of the IC chip, respectively.

2. The semiconductor package according to claim 1, wherein the material of the bonding layer is epoxy.

3. The semiconductor package according to claim 1, wherein the material of the underfill is polyurethane.

4. The semiconductor package according to claim 1, wherein a thickness of the bonding layer in an up and down direction is smaller than half of the solder portion in an up and down direction.

5. The semiconductor package according to claim 1, wherein a thickness of the underfill in an up and down direction is greater than a thickness of the solder portion in an up and down direction.

6. The semiconductor package according to claim 1, wherein the underfill includes a cured thermoplastic resin applied along a circumference of the IC chip.

7. The semiconductor package according to claim 1, wherein the connection portion is a circuit pattern electrically connected to the IC chip.

8. The semiconductor package according to claim 1, wherein the solder portion has a ball shape.

9. The semiconductor package according to claim 1, wherein the bonding layer is hardened by a reflow process to bond the solder portion onto the connection portion.

10. A manufacturing method of a semiconductor package comprising:

(a) supplying a printed circuit board;

(b) printing thermosetting resin on the printed circuit board;

(c) applying a solder paste to the printed circuit board;

(d) mounting an IC chip on the printed circuit board and applying thermoplastic resin around the IC chip; and (e) curing the thermosetting resin and the thermoplastic resin, wherein the thermoplastic resin comprises printing epoxy on the printed circuit board in a form of a gel-type resin, wherein the IC chip includes a first side, a second side opposing the first side, a third side connecting the first and second sides, and a fourth side opposing the third side, wherein the thermoplastic resin includes a first thermoplastic resin that overlaps, in a vertical direction, the first side and at least a portion of the third and fourth sides, and a second thermoplastic resin that overlaps, in the vertical direction, the second side and at least another portion of the third and fourth sides, and wherein the first thermoplastic resin and the second thermoplastic resin are horizontally spaced apart from each other at the third side and the fourth side of the IC chip, respectively.

11. The manufacturing method according to claim 10, wherein the thermoplastic resin includes polyurethane, and wherein the thermosetting resin includes epoxy.

12. The manufacturing method according to claim 10, further comprising:

inspecting mounting state of the IC chip after step (e).

13. The manufacturing method according to claim 12, further comprising:

dipping the IC chip in epoxy after step (c).

14. The manufacturing method according to claim 10, wherein in step (d), the thermoplastic resin is disposed to cover at least three sides of the IC chip.

* * * * *